(12) United States Patent
Takagi

(10) Patent No.: US 8,345,434 B2
(45) Date of Patent: Jan. 1, 2013

(54) HIGH FREQUENCY CIRCUIT HAVING MULTI-CHIP MODULE STRUCTURE

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 160 days.

(21) Appl. No.: 12/786,942

(22) Filed: May 25, 2010

(65) Prior Publication Data

US 2011/0044016 A1    Feb. 24, 2011

(30) Foreign Application Priority Data

Aug. 21, 2009   (JP) ................................ 2009-192326
Mar. 4, 2010   (JP) ................................ 2010-048155

(51) Int. Cl.
*H05K 1/18* (2006.01)

(52) U.S. Cl. ........ 361/761; 361/760; 361/763; 361/764; 361/766; 174/250; 174/255; 174/260; 174/261; 174/520; 257/691; 257/724; 257/728; 257/700

(58) Field of Classification Search .................. 361/761, 361/760, 763, 764, 766, 783; 174/250, 255, 174/260, 261, 520; 257/691, 724, 728, 700
See application file for complete search history.

(56) References Cited

U.S. PATENT DOCUMENTS

| | | | | |
|---|---|---|---|---|
| 3,515,945 A * | 6/1970 | Bohm | ............................ | 361/111 |
| 3,790,825 A * | 2/1974 | Barron et al. | .................. | 327/566 |
| 3,825,995 A * | 7/1974 | Kurz et al. | ...................... | 438/148 |
| 3,825,996 A * | 7/1974 | Barron et al. | .................. | 438/148 |
| 5,272,457 A * | 12/1993 | Heckaman et al. | ........... | 333/262 |
| 5,635,748 A * | 6/1997 | Nishizaka | ...................... | 257/390 |
| 5,747,854 A * | 5/1998 | Gotou | ............................ | 257/368 |
| 6,201,445 B1 * | 3/2001 | Morimoto et al. | ............. | 330/295 |
| 6,252,179 B1 * | 6/2001 | Lauffer et al. | ................. | 174/263 |
| 6,344,775 B1 * | 2/2002 | Morizuka et al. | ............. | 330/288 |
| 6,384,701 B1 * | 5/2002 | Yamada et al. | ................ | 333/247 |
| 6,400,035 B1 | 6/2002 | Hirata et al. | | |
| 6,562,127 B1 * | 5/2003 | Kud et al. | ......................... | 117/94 |
| 6,563,366 B1 * | 5/2003 | Kohama | ........................ | 327/382 |
| 7,081,653 B2 * | 7/2006 | Kawanaka | ..................... | 257/347 |
| 7,310,019 B2 * | 12/2007 | Gotou et al. | ................... | 330/295 |
| 7,312,405 B2 * | 12/2007 | Hsu | ............................... | 174/262 |
| 7,372,334 B2 * | 5/2008 | Blair et al. | ..................... | 330/302 |
| 7,411,288 B2 | 8/2008 | Takagi | | |
| 7,436,070 B2 * | 10/2008 | Uno et al. | ...................... | 257/777 |
| 7,486,157 B2 * | 2/2009 | Takagi | ............................ | 333/34 |

(Continued)

FOREIGN PATENT DOCUMENTS

JP          02-019008          1/1990
(Continued)

OTHER PUBLICATIONS

U.S. Appl. No. 12/913,170, filed Oct. 27, 2010, Takagi.
(Continued)

*Primary Examiner* — David Vu
*Assistant Examiner* — Caleb Henry
(74) *Attorney, Agent, or Firm* — Oblon, Spivak, McClelland, Maier & Neustadt, L.L.P.

(57) ABSTRACT

According to one embodiment, there is a high frequency circuit having a multi-chip module structure, including a semiconductor substrate set formed with discrete transistors connected in series, a first dielectric substrate set formed with capacitors, and a second dielectric substrate set formed with strip lines.

15 Claims, 14 Drawing Sheets

U.S. PATENT DOCUMENTS

| | | | |
|---|---|---|---|
| 7,576,423 B2 | 8/2009 | Takagi | |
| 7,605,465 B2 * | 10/2009 | Takagi | 257/707 |
| 7,638,875 B2 * | 12/2009 | Chiang | 257/724 |
| 7,659,613 B2 | 2/2010 | Takagi | |
| 7,667,322 B2 * | 2/2010 | Takagi | 257/728 |
| 7,674,986 B2 * | 3/2010 | Chang et al. | 174/260 |
| 7,741,907 B2 * | 6/2010 | Takagi | 330/251 |
| 7,767,589 B2 * | 8/2010 | Bedinger et al. | 438/758 |
| 7,777,571 B2 * | 8/2010 | Gotou et al. | 330/295 |
| 7,902,083 B2 * | 3/2011 | Bedinger et al. | 438/758 |
| 8,148,830 B2 * | 4/2012 | Bedinger et al. | 257/790 |
| 8,173,906 B2 * | 5/2012 | Bedinger et al. | 174/258 |
| 2003/0011435 A1 * | 1/2003 | Mori et al. | 330/295 |
| 2004/0178854 A1 * | 9/2004 | Inoue et al. | 330/302 |
| 2005/0263880 A1 * | 12/2005 | Igarashi et al. | 257/723 |
| 2007/0229187 A1 * | 10/2007 | Takagi | 333/125 |
| 2008/0023826 A1 * | 1/2008 | Takagi | 257/727 |
| 2008/0094141 A1 * | 4/2008 | Gotou et al. | 330/295 |
| 2008/0106879 A1 * | 5/2008 | Ryu et al. | 361/783 |
| 2008/0185173 A1 * | 8/2008 | Bedinger et al. | 174/258 |
| 2009/0039966 A1 * | 2/2009 | Chow et al. | 330/307 |
| 2009/0108392 A1 * | 4/2009 | Davies | 257/503 |
| 2009/0224339 A1 * | 9/2009 | Gogoi et al. | 257/413 |
| 2009/0251119 A1 * | 10/2009 | Stojcic et al. | 323/282 |
| 2009/0267080 A1 * | 10/2009 | Takagi | 257/76 |
| 2010/0069020 A1 * | 3/2010 | Koya et al. | 455/78 |
| 2010/0102443 A1 | 4/2010 | Takagi | |
| 2010/0200979 A1 * | 8/2010 | Blair et al. | 257/691 |

FOREIGN PATENT DOCUMENTS

| | | |
|---|---|---|
| JP | 10-163772 | 6/1998 |
| JP | 2000-49549 | 2/2000 |
| JP | 2001-274331 | 10/2001 |
| JP | 2002-110737 | 4/2002 |
| JP | 2003-078102 | 3/2003 |
| JP | 2003-110381 | 4/2003 |
| KR | 10-0251007 | 4/2000 |

OTHER PUBLICATIONS

Office Action issued on Aug. 29, 2011 in the corresponding Korean Patent Application No. 10-2010-47270 (with English Translation).
U.S. Appl. No. 12/976,207, filed Dec. 22, 2010, Takagi.
U.S. Appl. No. 12/551,981, filed Sep. 1, 2009, Kazutaka Takagi.
U.S. Appl. No. 12/294,620, filed Sep. 26, 2008, Kazutaka Takagi.
Office Action mailed Oct. 2, 2012, in Japanese Patent Application No. 2010-048155, filed Mar. 4, 2010 (w/English-language Translation), 4 pages.

* cited by examiner

HIGH FREQUENCY CIRCUIT HAVING MULTI-CHIP MODULE STRUCTURE

CROSS REFERENCE TO RELATED APPLICATIONS

This application is based upon and claims the benefits of priorities from prior Japanese Patent Application Nos. P2009-192326 and P2010-48155 filed on Aug. 21, 2009 and Mar. 4, 2010, respectively, the entire contents of which are incorporated herein by reference.

FIELD

Embodiments described herein relate generally to a high frequency circuit having a multi-chip module structure.

BACKGROUND

To increase the gain of a single package, the package should have stages of transistors therein connected in series. As a technique for such transistor stages to be formed on a single semiconductor substrate together with associated matching circuits and bias circuits, the MMIC (Monolithic Microwave Integrated Circuit) has been actively used.

To implement the MMIC, there has been use of a semiconductor substrate with circuitry integrated thereon including semiconductor devices, input and output matching circuits, capacitors, power supply lines, and so on, as necessary.

Such the MMIC had a combination of transistors and matching circuits formed on a single substrate, with a fixed dielectric permittivity. As a result, for provision of greater capacitors or longer lines, the circuit configuration needed an increased area.

For the MMIC, there are applicable transistors including, among others, SiC (silicon carbide) transistors and GaN (gallium nitride) transistors having higher output power than transistors having been used ever, including, among others, Si (silicon) transistors and GaAs (Gallium Arsenide) transistors. However, applicable materials such as SiC and GaN are more expensive than materials used such as Si and GaAs, and cost high the MMIC to be provided with circuitry of anyone of those, including semiconductor devices, matching circuits, and bias circuits formed on a substrate.

DETAILED DESCRIPTION

There will be described embodiments with reference to the drawings.

According to an embodiment, there is a high frequency circuit having a multi-chip module structure comprising a semiconductor substrate set formed with discrete transistors which are connected in series, a first dielectric substrate set formed with capacitors, and a second dielectric substrate set formed with strip lines.

According to another embodiment, there is a high frequency circuit having a multi-chip module structure comprising a semiconductor substrate set formed with discrete transistors connected in series, a first dielectric substrate set formed with capacitors, a second dielectric substrate set formed with strip lines, a package substrate for the semiconductor substrate set, the first dielectric substrate set, and the second dielectric substrate set to be disposed thereon, and a combination of an input terminal and an output terminal disposed on opposite sides of the package substrate, wherein the discrete transistors have directions of signal transmission between gate terminal electrodes and drain terminal electrodes thereof arranged to alternate every stage.

First Embodiment

Figure 1:
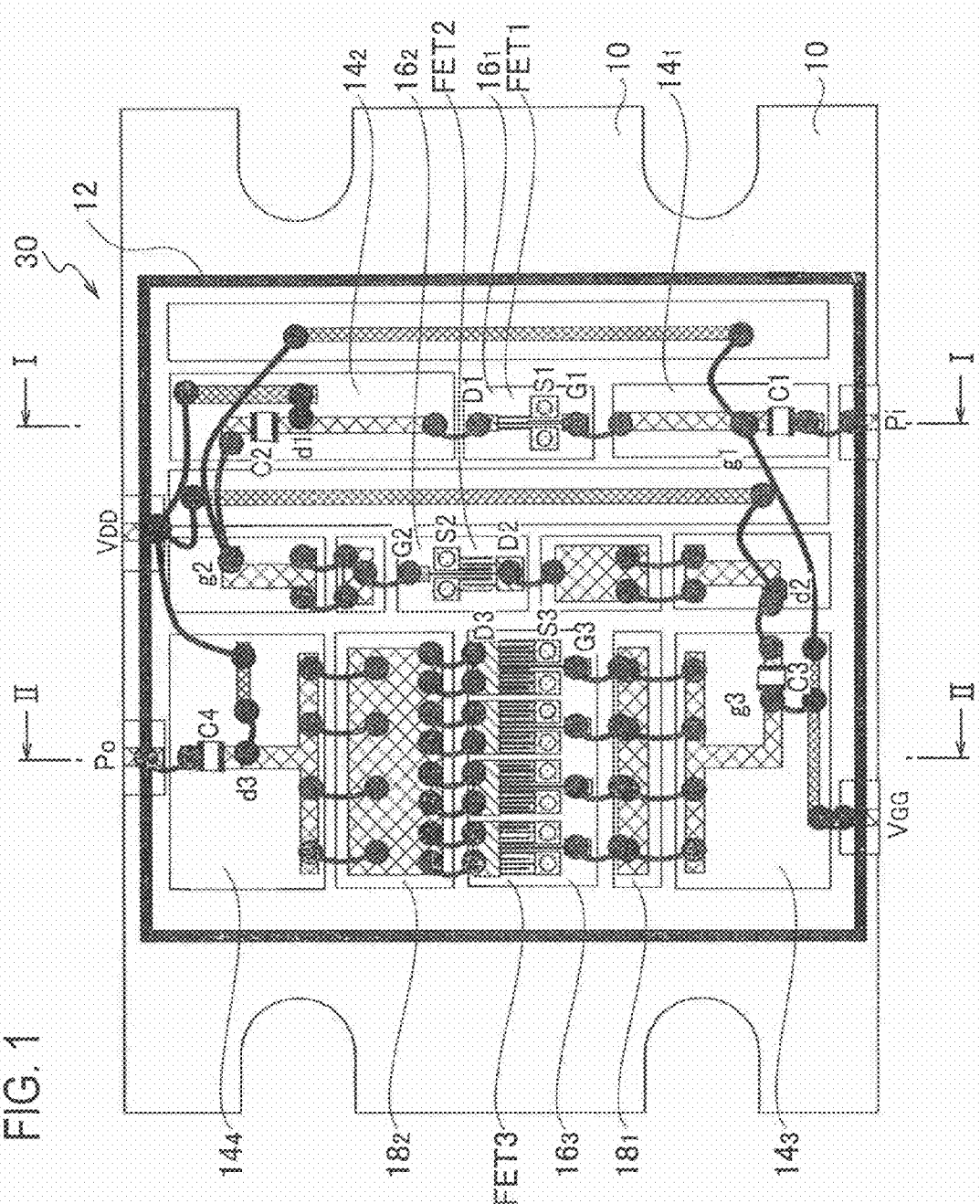
FIG. 1 is a schematic view of a planar pattern configuration of a high frequency circuit having a multi-chip module structure according to a first embodiment.

FIG. 1 shows in schematic view a planar pattern configuration of a high frequency circuit 30 having a multi-chip module structure according to a first embodiment. This includes: a semiconductor substrate set as a set of semiconductor substrates $16_1$, $16_2$, and $16_3$ formed with discrete transistors FET1, FET2, and FET3; a first dielectric substrate set as a first set of dielectric substrates $14_1$, $14_2$, $14_3$, and $14_4$ formed with capacitors C1, C2, C3, and C4; and a second dielectric substrate set as a second set of dielectric substrates $18_1$ and $18_2$ formed with strip lines. The discrete transistors FET1, FET2, and FET3 are connected in series.

The discrete transistors FET1, FET2, and FET3 are formed on separate semiconductor substrates $16_1$, $16_2$, and $16_3$, respectively.

For accommodation into a package, there is a single package substrate 10 configured to dispose thereon: respective semiconductor substrates $16_1$, $16_2$, and $16_3$ constituting the semiconductor substrate set, respective dielectric substrates $14_1$, $14_2$, $14_3$, and $14_4$ constituting the first dielectric substrate set (each referred herein to as a first dielectric substrate), and respective dielectric substrates $18_1$ and $18_2$ constituting the second dielectric substrate set (each referred herein to as a second dielectric substrate); and a frame member 12 configured to enclose the semiconductor substrates $16_1$, $16_2$, and $16_3$, the first dielectric substrates $14_1$, $14_2$, $14_3$, and $14_4$, and the second dielectric substrates $18_1$ and $18_2$.

The semiconductor substrates $16_1$, $16_2$, and $16_3$ with the discrete transistors FET1, FET2, and FET3 mounted thereon may be mounted directly on a surface of the package substrate 10.

The semiconductor substrates $16_1$, $16_2$, and $16_3$ may simply include the discrete transistors FET1, FET2, and FET3, and gate terminal electrodes G1, G2, and G3, source terminal electrodes S1, S2, and S3, and drain terminal electrodes D1, D2, and D3 of the discrete transistors FET1, FET2, and FET3, as circuit elements thereof, respectively.

According to the first embodiment, the high frequency circuit 30 having a multi-chip module structure may well have a planar pattern configuration including directions of signal transmission of the discrete transistors FET1, FET2, and FET3 arranged to alternate every stage. In the example of configuration shown in FIG. 1, there is a direction of signal transmission from the gate terminal electrode G1 to the drain terminal electrode D1 of the discrete transistor FET1 oriented opposite to a direction of signal transmission from the gate terminal electrode G2 to the drain terminal electrode D2 of the discrete transistor FET2, as well as a direction of signal transmission from the gate terminal electrodes G3 to the drain terminal electrodes D3 of the discrete transistor FET3 oriented opposite to the direction of signal transmission from the gate terminal electrode G2 to the drain terminal electrode D2 of the discrete transistor FET2.

Figure 2:
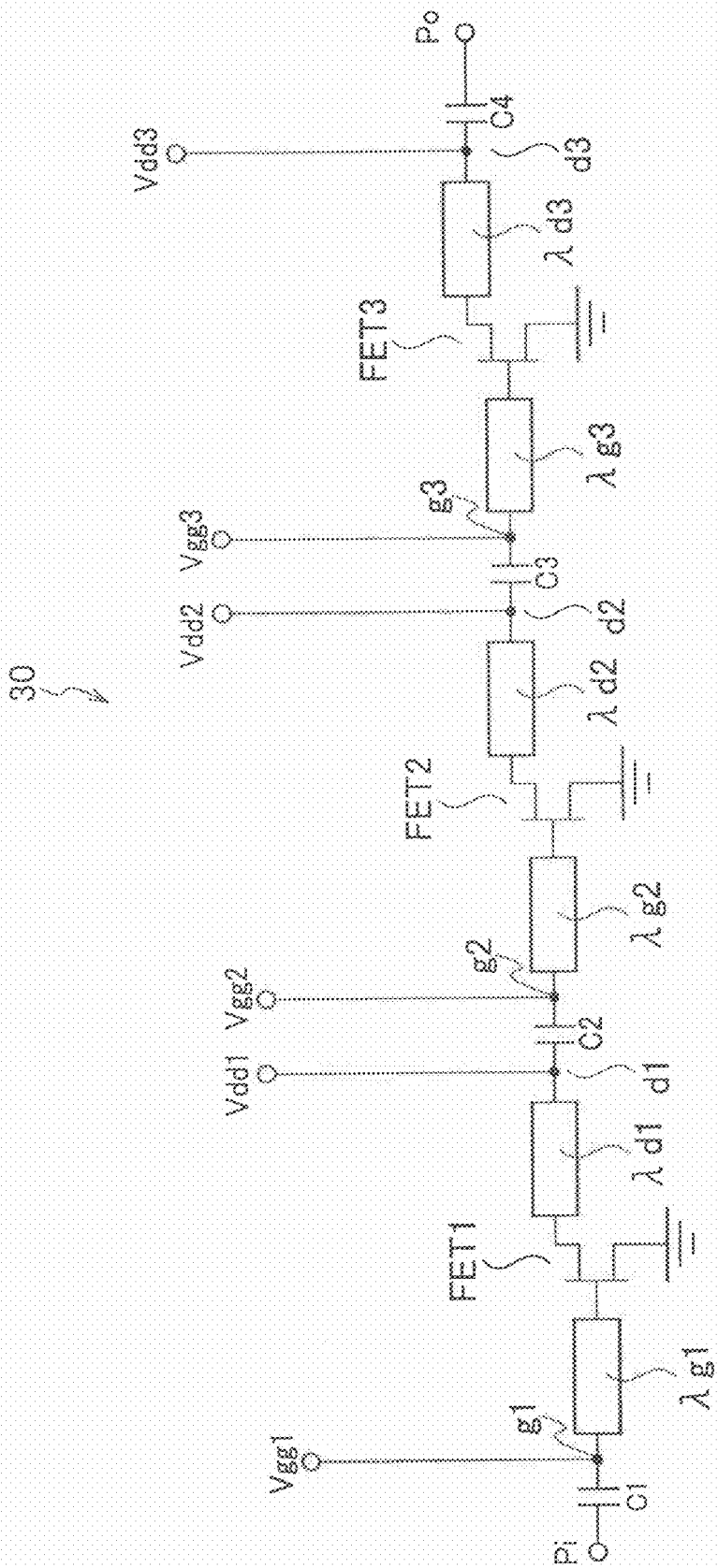
FIG. 2 is a schematic circuit diagram of part of the high frequency circuit of FIG. 1 including a multi-staged amplification circuit configured with three stages of discrete transistors FET1 to FET3 connected in series.

FIG. 2 schematically shows a circuit diagram of part of the high frequency circuit 30 of FIG. 1 including a multi-staged amplification circuit. As shown in FIG. 2, there is a combination of three stages of discrete transistors FET1, FET2, and FET3 cascade-connected in series to constitute a multi-stage amplifier.

As shown in FIG. 2, as well as in FIG. 1, the capacitor C1 is connected to an input terminal Pi, and the capacitor C4 is connected to an output terminal Po.

The input terminal Pi is connected via the capacitor C1 to a gate input terminal g1, which is supplied with a gate voltage Vgg1 from a terminal of gate bias voltage Vgg (cf. FIG. 1).

The gate input terminal g1 is connected through an input transfer line λg1 to the gate terminal electrode G1 of the discrete transistor FET1.

The drain terminal electrode D1 of the discrete transistor FET1 is connected through an output transfer line λd1 to a drain output terminal d1.

The drain output terminal d1 is supplied with a drain voltage Vdd1 from a terminal of drain bias voltage $V_{DD}$ (cf. FIG. 1).

The drain output terminal d1 is connected with the capacitor C2.

The drain output terminal d1 is connected via the capacitor C2 to a gate input terminal g2, which is supplied with a gate voltage Vgg2 from the terminal of gate bias voltage Vgg.

The gate input terminal g2 is connected through an input transfer line λg2 to the gate terminal electrode G2 of the discrete transistor FET2.

The drain terminal electrode D2 of the discrete transistor FET2 is connected through an output transfer line λd2 to a drain output terminal d2.

The drain output terminal d2 is supplied with a drain voltage Vdd2 from the terminal of drain bias voltage $V_{DD}$.

The drain output terminal d2 is connected with the capacitor C3.

The drain output terminal d2 is connected via the capacitor C3 to gate input terminals g3 (cf. FIG. 1), which are supplied with a gate voltage Vgg3 from the terminal of gate bias voltage Vgg.

The gate input terminals g3 are connected through input transfer lines g3 to the gate terminal electrodes G3 of the discrete transistor FET3 (cf. FIG. 1).

The drain terminal electrodes D3 of the discrete transistor FET3 are connected through output transfer lines λd3 to a drain output terminal d3 (cf. FIG. 1).

The drain output terminal d3 is supplied with a drain voltage Vdd3 from the terminal of drain bias voltage $V_{DD}$.

The drain output terminal d3 is connected with the capacitor C4 that is connected to the output terminal Po.

Among discrete transistors FET1, FET2, and FET3, the discrete transistor FET2 disposed in the second stage may well have a narrower gate width the those discrete transistor FET3 disposed in the third or last stage, for cascade connection to constitute a multi-stage amplifier.

Further, among discrete transistors FET1, FET2, and FET3, the discrete transistor FET1 disposed in the first stage may well have a narrower gate width than the discrete transistor FET2 disposed in the second stage, for cascade connection to constitute a multi-stage amplifier.

For the high frequency circuit 30 having a multi-chip module structure according to the first embodiment, three may be discrete transistors FET1, FET2, and FET3 each configured for application thereto as an FET (Field Effect Transistor), a HEMT (High Electron Mobility Transistor), or the like.

Figure 3:
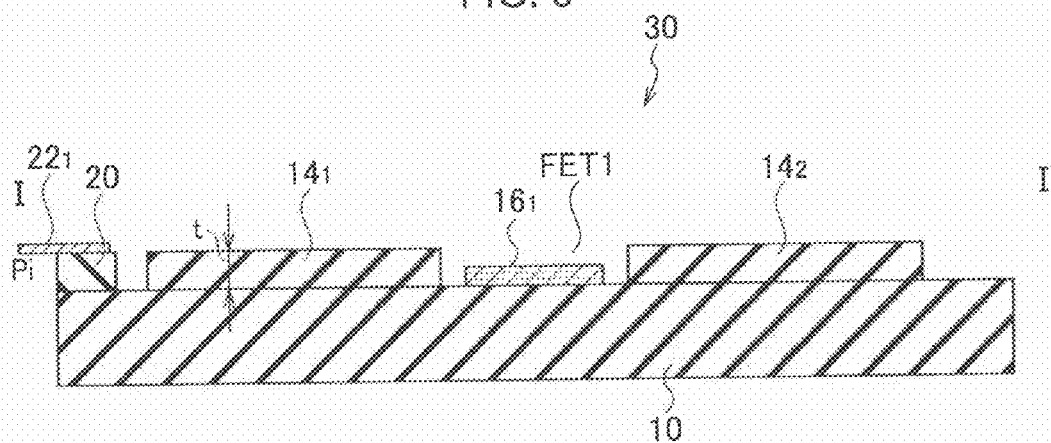
FIG. 3 is a schematic sectional view along line I-I of the high frequency circuit of FIG. 1.

FIG. 3 shows a schematic section along line I-I of FIG. 1. According to the first embodiment, the high frequency circuit 30 has in the section: the package substrate 10; an insulating layer 20 disposed on the package substrate 10; an input strip line $22_1$ disposed on the insulating layer 20; the first dielectric substrates $14_1$ and $14_2$ disposed on the package substrate 10; and the semiconductor substrate $16_1$ disposed on the package substrate 10.

The first dielectric substrates $14_1$ and $14_2$ have the capacitors C1 and C2 (cf. FIG. 1) disposed thereon, respectively, and the semiconductor substrate $16_1$ has the discrete transistor FET1 disposed thereon.

The first dielectric substrate $14_1$ may have a thickness t thereof adjusted for application as a capacitor constituting substrate. The thickness t of the first dielectric substrate $14_1$ is variable to change the capacitance. Likewise, the first dielectric substrate $14_1$ may have an electric permittivity thereof changed to change the capacitance.

Figure 4:
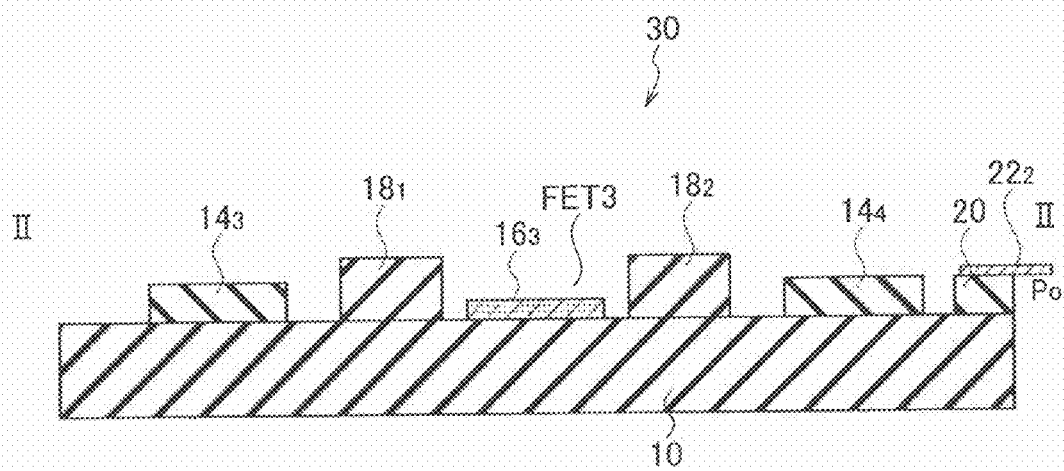
FIG. 4 is a schematic sectional view along line II-II of the high frequency circuit of FIG. 1.

FIG. 4 shows a schematic section along line II-II of FIG. 1. According to the first embodiment, the high frequency circuit 30 has in the section: the package substrate 10; an insulating layer 20 disposed on the package substrate 10; an output strip line $22_2$ disposed on the insulating layer 20; the first dielectric substrates $14_3$ and $14_4$ disposed on the package substrate 10; the semiconductor substrate $16_3$ disposed on the package substrate 10; and the second dielectric substrates $18_1$ and $18_2$ disposed on the package substrate 10.

The first dielectric substrates $14_3$ and $14_4$ have the capacitors C3 and C4 (cf. FIG. 1) disposed thereon, respectively, and the semiconductor substrate $16_3$ has the discrete transistor FET3 disposed thereon.

The second dielectric substrates $18_1$ and $18_2$ have an input matching circuit and an output matching circuit disposed thereon, respectively.

As illustrated in FIG. 4, the first dielectric substrates $14_3$ and $14_4$ as well as the second dielectric substrates $18_1$ and $18_2$ have their thicknesses as dimensions variable as necessary. They may have their dielectric constants changed for capacitor adjustments to adjust characteristic impedances of transmission lines to be arranged. Likewise, their capacitor areas, and stab lengths arranged may be widely reduced.

(Device Structure)

Figure 5A:
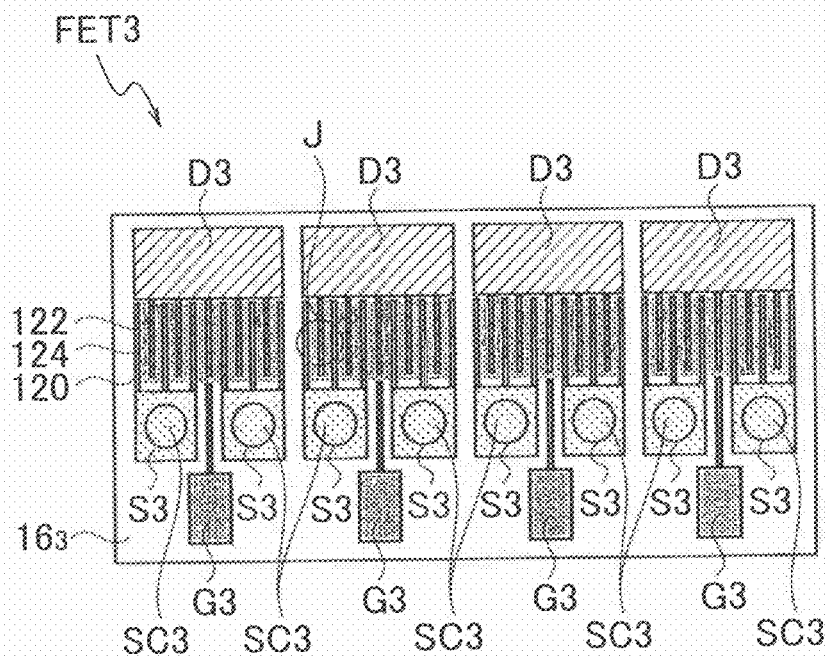
FIG. 5A is an enlarged schematic view of a planar pattern configuration of part of a high frequency circuit having a multi-chip module structure according to the first embodiment including a discrete transistor FET3.
Figure 5B:
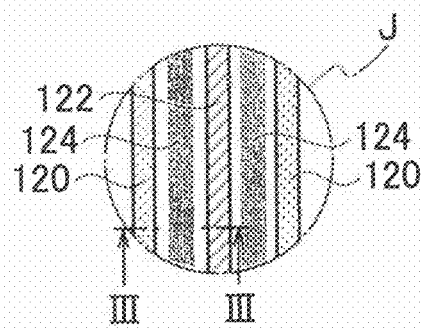
FIG. 5B is a detailed view of a fragment J in part of the high frequency circuit of FIG. 5A.

FIG. 5A shows a schematic planar pattern configuration of a high frequency circuit having a multi-chip module structure according to the first embodiment, as an enlarged view of part thereof including the discrete transistor FET3. FIG. 5B is a detailed view of a fragment J in part of the high frequency circuit of FIG. 5A. And, FIG. 6, FIG. 7, FIG. 8, and FIG. 9 each provide a schematic sectional view along line III-III in FIG. 5B as part of a high frequency circuit having a multi-chip module structure according to the first embodiment, constituting an example 1 of discrete transistor, an example 2 of discrete transistor, an example 3 of discrete transistor, and an example 4 of discrete transistor, respectively. According to the first embodiment, the discrete transistor FET1 as well as the discrete transistor FET2 may be similar in sectional structure to an arbitrary one of examples of discrete transistor FET3 shown in FIG. 6, FIG. 7, FIG. 8, and FIG. 9.

As shown in FIGS. 5A and 5B and/or FIGS. 6 to 9, in each high frequency circuit having a multi-chip module structure according to the first embodiment, the discrete transistor FET3 has: a semi-insulating substrate 110; sets of gate finger electrodes 124, source finger electrodes 120, and drain finger electrodes 122 each formed with fingers and disposed on a first surface area at a front side of the semi-insulating substrate 110; sets of gate terminal electrodes G3, source terminal electrodes S3, and drain terminal electrodes D3 formed with corresponding subsets of the sets of gate finger electrodes 124, source finger electrodes 120, and drain finger electrodes 122 and disposed on the first surface area of the semi-insulating substrate 110; a set of via holes SC3 each disposed under a corresponding source terminal electrode S3; and a grounding electrode (not shown) disposed on a second surface area at a backside opposite to the first surface area of the semi-insulating substrate 110, and connected through the via holes SC3 to the source terminal electrodes S3.

The semi-insulating substrate 110 may be a GaAs substrate, a SiC substrate, a GaN substrate, a SiC substrate with a GaN epitaxial layer formed thereon, a SiC substrate with a hetero-junction epitaxial layer composed of AaN/AlGaN formed thereon, a sapphire substrate, or a diamond substrate.

Structure Example 1

Figure 6:
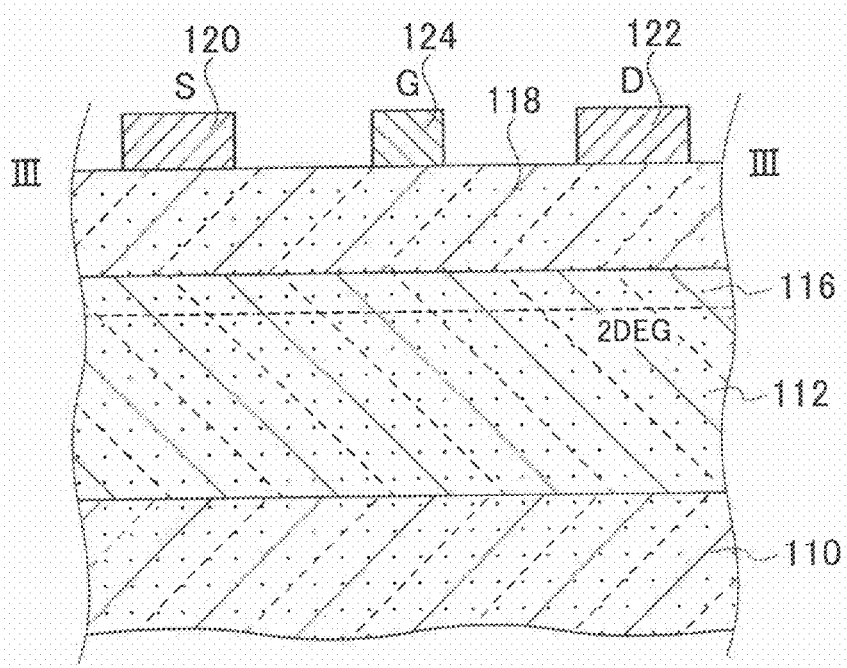
FIG. 6 is a schematic sectional view along line III-III in FIG. 5B as part of high frequency circuit constituting an example 1 of discrete transistor.

FIG. 6 shows a schematic sectional structure along line III-III in FIG. 5B, as a structure example 1 of discrete transistor that includes: the semi-insulating substrate 110; a nitride compound semiconductor layer 112 disposed on the semi-insulating substrate 110; an aluminum gallium nitride layer ($Al_xGa_{1-x}N$: $0.1 \leq x \leq 1$) 118 disposed on the nitride compound semiconductor layer 112; and a combination of source finger electrode 120, gate finger electrode 124, and drain finger electrode 122 disposed on the aluminum gallium nitride layer ($Al_xGa_{1-x}N$: $0.1 \leq x \leq 1$) 118. There is a 2DEG (Two Dimensional Electron Gas) layer 116 formed along an interface between the nitride compound semiconductor layer 112 and the aluminum gallium nitride layer ($Al_xGa_{1-x}N$: $0.1 \leq x \leq 1$) 118. In FIG. 6, the structure example 1 is implemented as a HEMT (High Electron Mobility Transistor).

Structure Example 2

Figure 7:
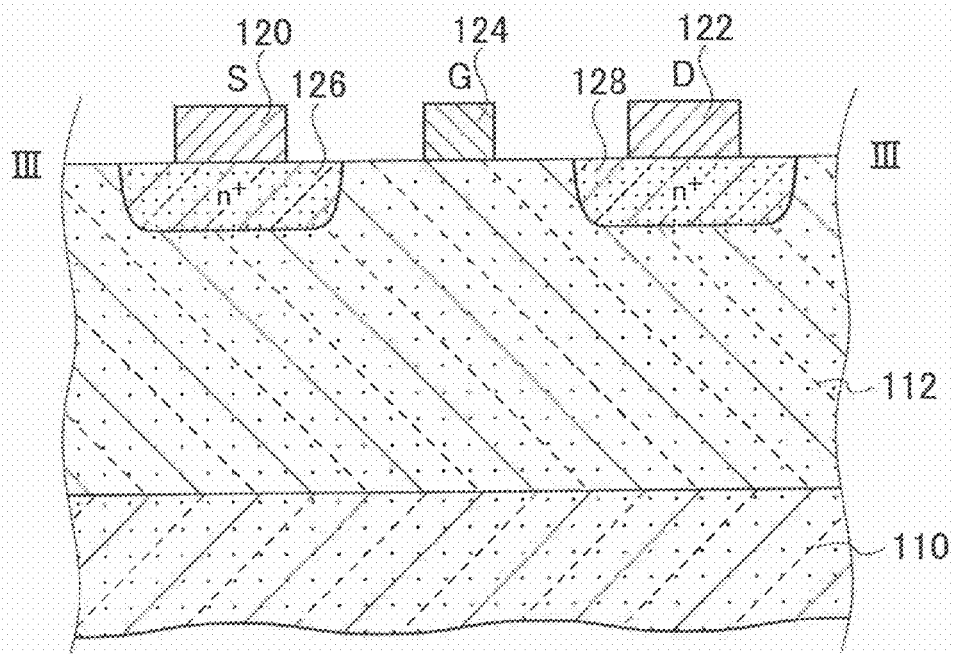
FIG. 7 is a schematic sectional view along line III-III in FIG. 5B as part of high frequency circuit constituting an example 2 of discrete transistor.

FIG. 7 shows a schematic sectional structure along line in FIG. 5B, as a structure example 2 of discrete transistor that includes: the semi-insulating substrate 110; a nitride compound semiconductor layer 112 disposed on the semi-insulating substrate 110; combination of a source region 126 and a drain region 128 each disposed on the nitride compound semiconductor layer 112; and combination of a source finger electrode 120 disposed on the source region 126, a gate finger electrode 124 disposed on the nitride compound semiconductor layer 112, and a drain finger electrode 122 disposed on the drain region 128. There is a Schottky contact formed at an interface between the nitride compound semiconductor layer 112 and the gate finger electrode 124. In FIG. 7, the structure example 2 is implemented as a MESFET (Metal Semiconductor Field Effect Transistor).

Structure Example 3

Figure 8:
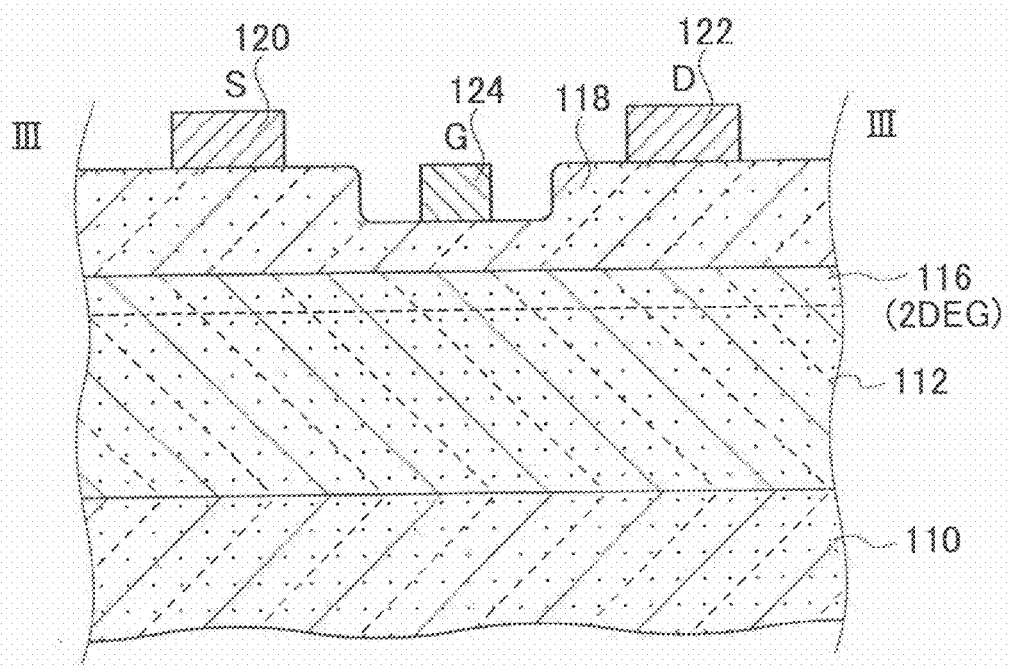
FIG. 8 is a schematic sectional view along line III-III in FIG. 5B as part of high frequency circuit constituting an example 3 of discrete transistor.

FIG. 8 shows a schematic sectional structure along line in FIG. 5B, as a structure example 3 of discrete transistor that includes: the semi-insulating substrate 110; a nitride compound semiconductor layer 112 disposed on the semi-insulating substrate 110; an aluminum gallium nitride layer ($Al_xGa_{1-x}N$: $0.1 \leq x \leq 1$) 118 disposed on the nitride compound semiconductor layer 112; and combination of a source finger electrode 120 and a drain finger electrode 122 each disposed on a surface area of the aluminum gallium nitride layer ($Al_xGa_{1-x}N$: $0.1 \leq x \leq 1$) 118, and a gate finger electrode 124 disposed in a recessed portion of the surface area of aluminum gallium nitride layer ($Al_xGa_{1-x}N$: $0.1 \leq x \leq 1$) 118. There is a 2DEG layer 116 formed along an interface between the nitride compound semiconductor layer 112 and the aluminum gallium nitride layer ($Al_xGa_{1-x}N$: $0.1 \leq x \leq 1$) 118. In FIG. 8, the structure example 3 is implemented as a HEMT.

Structure Example 4

Figure 9:
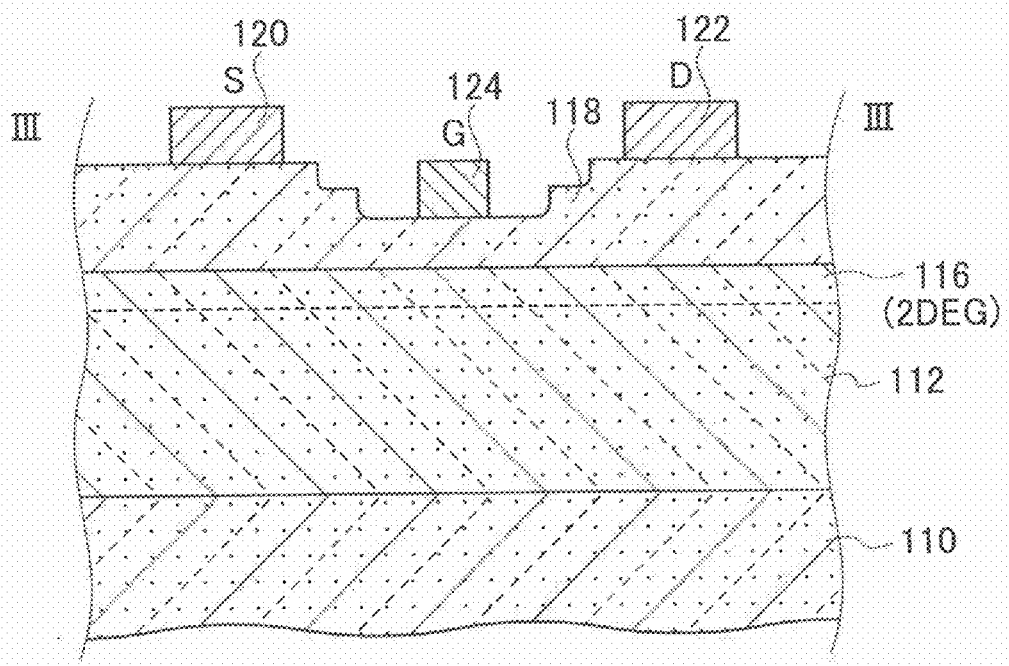
FIG. 9 is a schematic sectional view along line III-III in FIG. 5B as part of high frequency circuit constituting an example 4 of discrete transistor.

FIG. 9 shows a schematic sectional structure along line III-III in FIG. 5B, as a structure example 4 of discrete transistor that includes: the semi-insulating substrate 110; a nitride compound semiconductor layer 112 disposed on the semi-insulating substrate 110; an aluminum gallium nitride layer ($Al_xGa_{1-x}N$: $0.1 \leq x \leq 1$) 118 disposed on the nitride compound semiconductor layer 112; and combination of a source finger electrode 120 and a drain finger electrode 122 each disposed on a surface area of the aluminum gallium nitride layer ($Al_xGa_{1-x}N$: $0.1 \leq x \leq 1$) 118, and a gate finger electrode 124 disposed in a double-recessed portion of the surface area of aluminum gallium nitride layer ($Al_xGa_{1-x}N$: $0.1 \leq x \leq 1$) 118. There is a 2DEG layer 116 formed along an interface between the nitride compound semiconductor layer 112 and the aluminum gallium nitride layer ($Al_xGa_{1-x}N$: $0.1 \leq x \leq 1$) 118. In FIG. 9, the structure example 4 is implemented as a HEMT.

The structure example 4 include: electrically active regions encompassing regions of 2DEG layer 116 residing just below source finger electrodes 120, gate finger electrodes 124, and drain finger electrodes 122, and regions of 2DEG layer 116 residing between source and gate finger electrodes 120 and 124 and between drain and gate finger electrodes 122 and 124; and the remaining regions including electrically inactive regions of nitride compound semiconductor layer 112 employed as regions for device isolation.

There may be device isolation regions formed by doping ions into intermediate depths of nitride compound semiconductor layer 112 and aluminum gallium nitride layer ($Al_xGa_{1-x}N$: $0.1 \leq x \leq 1$) 118. Ion species may be nitride (N) or Argon (Ar), for instance. Dose of doped ions may be approximately $1 \times 10^{14}$ (ions/cm$^2$), for instance. Acceleration energy for the ion doping may be within a range of approximately 100 keV to 200 keV.

There is an insulation layer (not shown) for passivation on surfaces of devices and device isolation regions. There may be use of a PECVD (Plasma Enhanced Chemical Vapor Deposition) method, for instance, for deposition of a nitride layer, alumina ($Al_2O_3$) layer, oxide ($SiO_2$) layer, oxynitride (SiON) layer, or such to form the insulation layer.

Source finger electrodes 120 and drain finger electrodes 122 may be made of Ti/Al or the like, for instance. Gate finger electrodes 124 may be made of Ni/Au or the like, for instance.

Gate finger electrodes 124, source finger electrodes 120, and drain finger electrodes 122 have their longitudinal pattern lengths set shorter, as the working frequency becomes higher to cover microwaves, millimeter waves, and sub-millimeter waves.

According to the first embodiment, it is possible to implement a wide reduction of capacitor area and stab length, allowing for miniaturization in size of integrated circuits for application to microwaves or millimeter waves.

According to the first embodiment, there are combinations of transistors, matching circuits, and bias circuits individually arranged for connection in a package, allowing for a reduced size of device as a package.

According to the first embodiment, there are combinations of transistors, matching circuits, and bias circuits individually arranged for connection in a package, allowing for a reduced cost of device as a package.

According to the first embodiment, it is possible to provide an inexpensive high frequency circuit having a multi-chip module structure, affording to form matching circuits on an inexpensive dielectric substrate set, and miniaturize sizes of expensive semiconductor.

According to the first embodiment, it is possible to provide an inexpensive high frequency circuit having a multi-chip module structure, allowing for miniaturization in size of integrated circuits for application to microwaves or millimeter waves.

Second Embodiment

Figure 10:
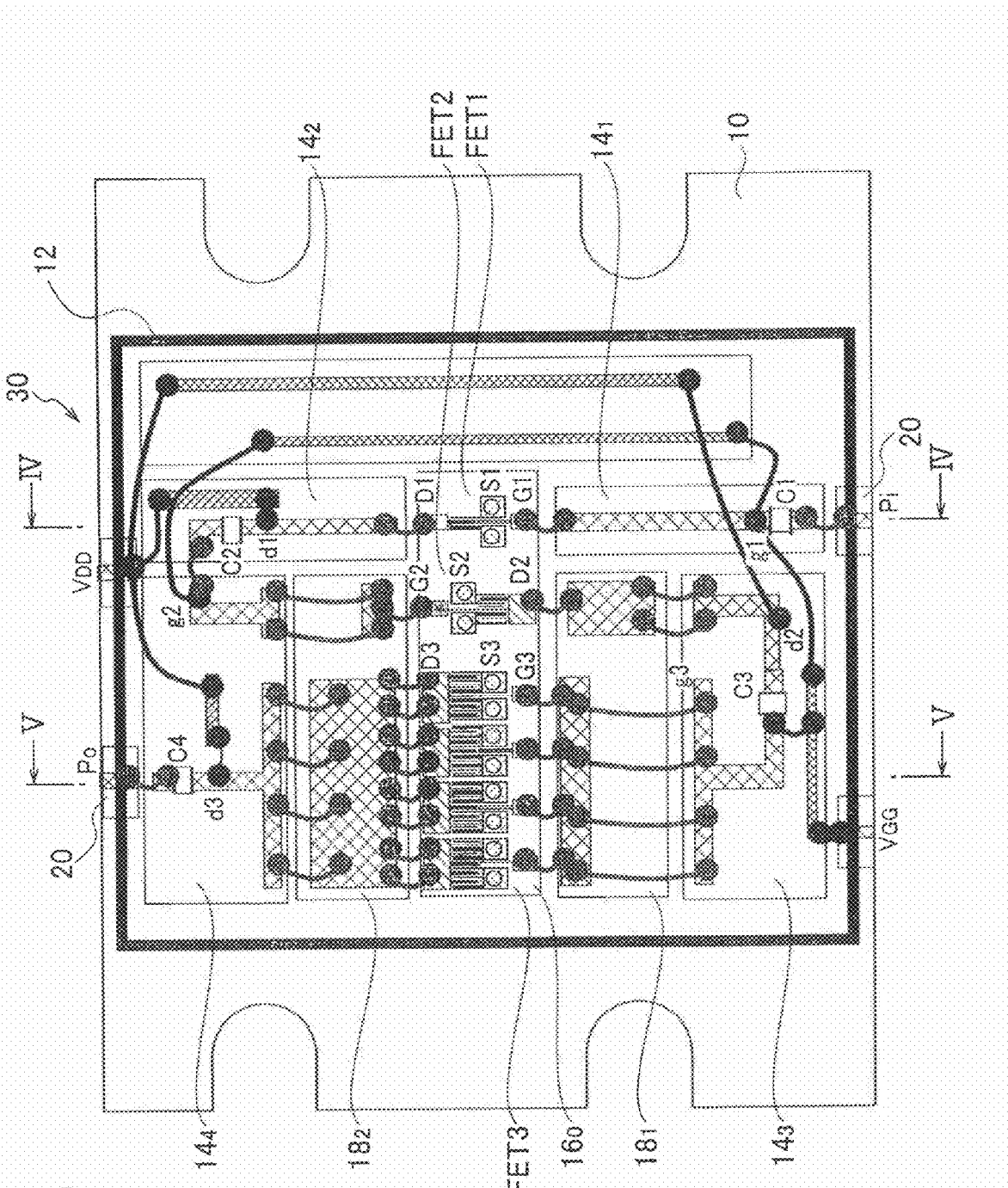
FIG. 10 is a schematic view of a planar pattern configuration of a high frequency circuit having a multi-chip module structure according to a second embodiment.

FIG. 10 shows in schematic view a planar pattern configuration of a high frequency circuit 30 having a multi-chip module structure according to a second embodiment. This includes: a semiconductor substrate set consisting of a semiconductor substrate $16_0$ formed with discrete transistors FET1, FET2, and FET3; a first dielectric substrate set as a first set of dielectric substrates $14_1$, $14_2$, $14_3$, and $14_4$ formed with capacitors C1, C2, C3, and C4; and a second dielectric substrate set as a second set of dielectric substrates $18_1$ and $18_2$ formed with strip lines. The discrete transistors FET1, FET2, and FET3 are connected in series.

The discrete transistors FET1, FET2, and FET3 are wholly integrated to form on the semiconductor substrate $16_0$, with an increased degree of integration relative to the first embodiment.

For accommodation into a package, there is a single package substrate 10 configured to dispose thereon: the semiconductor substrate $16_0$ constituting the semiconductor substrate set, respective dielectric substrates $14_1$, $14_2$, $14_3$, and $14_4$ constituting the first dielectric substrate set (each referred herein to as a first dielectric substrate), and respective dielectric substrates $18_1$ and $18_2$ constituting the second dielectric substrate set (each referred herein to as a second dielectric substrate); and a frame member 12 configured to enclose the semiconductor substrates $16_0$, the first dielectric substrates $14_1$, $14_2$, $14_3$, and $14_4$, and the second dielectric substrates $18_1$ and $18_2$.

The semiconductor substrate $16_0$ with the discrete transistors FET1, FET2, and FET3 mounted thereon may be mounted directly on a surface of the package substrate 10.

The semiconductor substrate $16_0$ may simply include the discrete transistors FET1, FET2, and FET3, and gate terminal electrodes G1, G2, and G3, source terminal electrodes S1, S2, and S3, and drain terminal electrodes D1, D2, and D3 of the discrete transistors FET1, FET2, and FET3, as circuit elements thereof.

The high frequency circuit 30 shown in FIG. 10 includes a multi-staged amplification circuit configured like that shown in FIG. 2. There is a combination of three stages of discrete transistors FET1, FET2, and FET3 cascade-connected in series to constitute a multi-stage amplifier.

For the high frequency circuit 30 having a multi-chip module structure according to the second embodiment, three may be discrete transistors FET1, FET2, and FET3 configured for application thereto as an FET, a HEMT, or the like.

As shown in FIG. 10, the capacitor C1 is connected to an input terminal Pi, and the capacitor C4 is connected to an output terminal Po.

The input terminal Pi is connected via the capacitor C1 to a gate input terminal g1, which is supplied with a gate voltage Vgg1 from a terminal of gate bias voltage Vgg.

The gate input terminal g1 is connected through an input transfer line λg1 to the gate terminal electrode G1 of the discrete transistor FET1.

The drain terminal electrode D1 of the discrete transistor FET1 is connected through an output transfer line λd1 to a drain output terminal d1.

The drain output terminal d1 is supplied with a drain voltage Vdd1 from a terminal of drain bias voltage $V_{DD}$.

The drain output terminal d1 is connected with the capacitor C2.

The drain output terminal d1 is connected via the capacitor C2 to a gate input terminal g2, which is supplied with a gate voltage Vgg2 from the terminal of gate bias voltage Vgg.

The gate input terminal g2 is connected through an input transfer line λg2 to the gate terminal electrode G2 of the discrete transistor FET2. The input transfer line λg2 is disposed on the first dielectric substrate $14_4$, with an increased degree of integration relative to the first embodiment.

The drain terminal electrode D2 of the discrete transistor FET2 is connected through an output transfer line λd2 to a drain output terminal d2. The output transfer line λd2 is disposed on the first dielectric substrate $14_3$, with an increased degree of integration relative to the first embodiment.

The drain output terminal d2 is supplied with a drain voltage Vdd2 from a terminal of drain bias voltage $V_{DD}$.

The drain output terminal d2 is connected with the capacitor C3.

The drain output terminal d2 is connected via the capacitor C3 to gate input terminals g3, which are supplied with a gate voltage Vgg3 from the terminal of gate bias voltage Vgg.

The gate input terminals g3 are connected through input transfer lines λg3 to the gate terminal electrodes G3 of the discrete transistor FET3.

The drain terminal electrode D3 of the discrete transistor FET3 are connected through output transfer lines λd3 to a drain output terminal d3.

The drain output terminal d3 is supplied with a drain voltage Vdd3 from the terminal of drain bias voltage $V_{DD}$.

The drain output terminal d3 is connected with the capacitor C4 that is connected to the output terminal Po.

Among discrete transistors FET1, FET2, and FET3, the discrete transistor FET2 disposed in the second stage may well have a narrower gate width than the discrete transistor FET3 disposed in the third or last stage, for cascade connection to constitute a multi-stage amplifier.

Further, among discrete transistors FET1, FET2, and FET3, the discrete transistor FET1 disposed in the first stage may well have a narrower gate width than the discrete transistor FET2 disposed in the second stage, for cascade connection to constitute a multi-stage amplifier.

Figure 11:
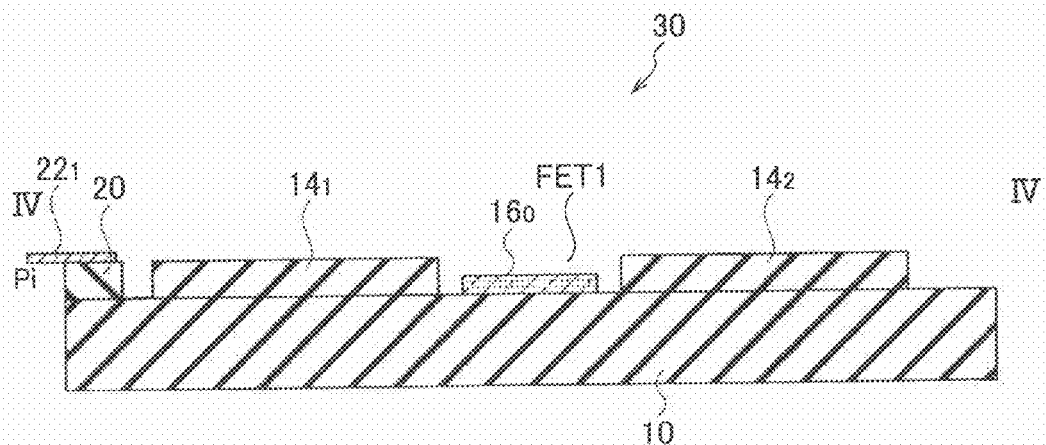
FIG. 11 is a schematic sectional view along line IV-IV of the high frequency circuit of FIG. 10.

FIG. 11 shows a schematic section along line IV-IV of FIG. 10. According to the second embodiment, the high frequency circuit 30 has in the section: the package substrate 10; an insulating layer 20 disposed on the package substrate 10; an input strip line $22_1$ disposed on the insulating layer 20; the first dielectric substrates $14_1$ and $14_2$ disposed on the package substrate 10; and the semiconductor substrate $16_0$ disposed on the package substrate 10.

The first dielectric substrates $14_1$ and $14_2$ have the capacitors C1 and C2 (cf. FIG. 10) disposed thereon, respectively, and the semiconductor substrate $16_0$ has the discrete transistor FET1 disposed thereon.

The first dielectric substrate $14_1$ may have a thickness thereof adjusted for application as a capacitor constituting substrate. At the first dielectric substrate $14_1$, the thickness is variable to change the capacitance. Likewise, the first dielectric substrate $14_1$ may have an electric permittivity thereof changed to change the capacitance.

FIG. 11 shows a schematic section along line V-V of FIG. 10. According to the second embodiment, the high frequency circuit 30 has in the section: the package substrate 10; an insulating layer 20 disposed on the package substrate 10; an output strip line $22_2$ disposed on the insulating layer 20; the first dielectric substrates $14_3$ and $14_4$ disposed on the package substrate 10; the semiconductor substrate $16_0$ disposed on the package substrate 10; and the second dielectric substrates $18_1$ and $18_2$ disposed on the package substrate 10.

The first dielectric substrates $14_3$ and $14_4$ have the capacitors C3 and C4 (cf. FIG. 10) disposed thereon, respectively, and the semiconductor substrate $16_0$ has the discrete transistor FET3 disposed thereon.

The second dielectric substrates $18_1$ and $18_2$ have an input matching circuit and an output matching circuit disposed thereon, respectively.

Figure 12:
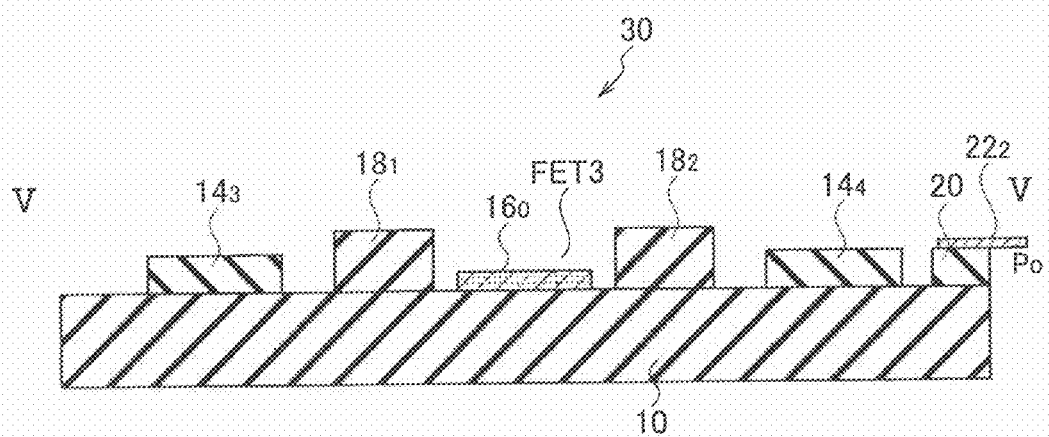
FIG. 12 is a schematic sectional view along line V-V of the high frequency circuit of FIG. 10.

As illustrated in FIG. 12, the first dielectric substrates $14_3$ and $14_4$ as well as the second dielectric substrates $18_1$ and $18_2$ have their thicknesses as dimensions variable as necessary. They may have their dielectric constants changed for capacitor adjustments to adjust characteristic impedances of transmission lines to be arranged. Likewise, their capacitor areas, and stab lengths arranged may be widely reduced.

(Device Structure)

In the high frequency circuit 30 having a multi-chip module structure according to the second embodiment, the discrete transistor FET3 is similar in planar pattern to configurations shown in FIG. 5A and FIG. 5B, and may have a similar sectional structure to an arbitrary one of examples of discrete transistor shown in FIG. 6, FIG. 7, FIG. 8, and FIG. 9. According to the second embodiment, the discrete transistor FET1 as well as the discrete transistor FET2 may have a similar sectional structure to an arbitrary one of examples of discrete transistor shown in FIG. 6, FIG. 7, FIG. 8, and FIG. 9.

(Direction of Signal Transmission)

Figure 13:
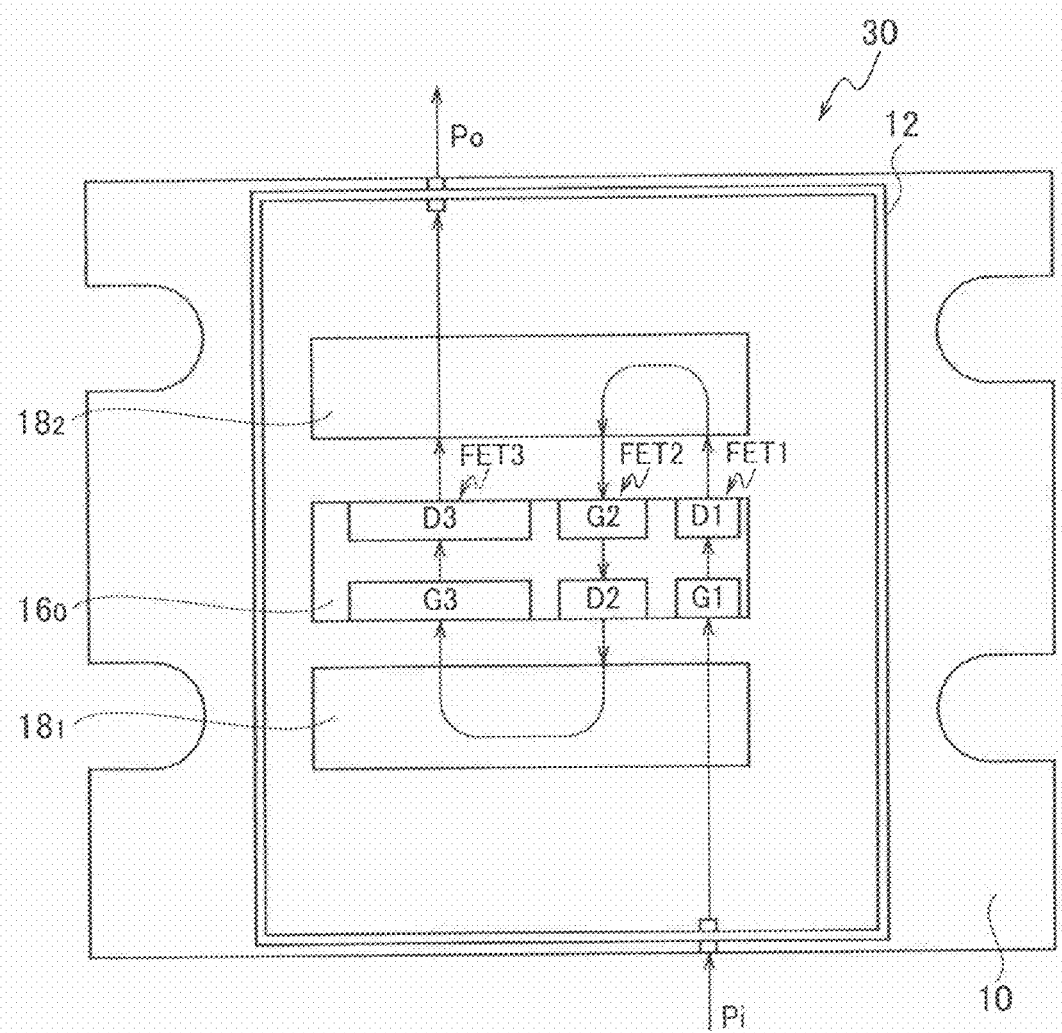
FIG. 13 is a schematic view of a planar pattern configuration of a high frequency circuit having a multi-chip module structure according to the second embodiment, with a signal flow from an input terminal Pi to an output terminal Po for discrete transistors FET1 to FET3 disposed on a semiconductor substrate $16_0$.

FIG. 13 is a schematic view of a planar pattern configuration of the high frequency circuit 30 having a multi-chip module structure according to the second embodiment. FIG. 13 describes a signal flow from the input terminal Pi to the output terminal Po for the discrete transistors FET1 to FET3 disposed on the same semiconductor substrate $16_0$, and shows the semiconductor substrate $16_0$ together with the second dielectric substrates $18_1$ and $18_2$ put in peripheral areas thereof, while omitting the first dielectric substrates $14_1$ to $14_4$. It will be seen from FIG. 10 that FIG. 13 shows transmission of signals from the drain terminal electrode D1 to the gate terminal electrode G2 by a flow path passing an area on the second dielectric substrate $18_2$, while this flow path passes corresponding areas on the omitted first dielectric substrates $14_2$ and $14_4$, as well. Likewise, it will also be seen from FIG. 10 that FIG. 13 shows transmission of signals from the drain terminal electrode D2 to a respective gate terminal electrode G3 by a flow path passing an area on the second dielectric substrate $18_1$, while this flow path passes a corresponding area on the omitted first dielectric substrate $14_3$, as well.

Figure 14:
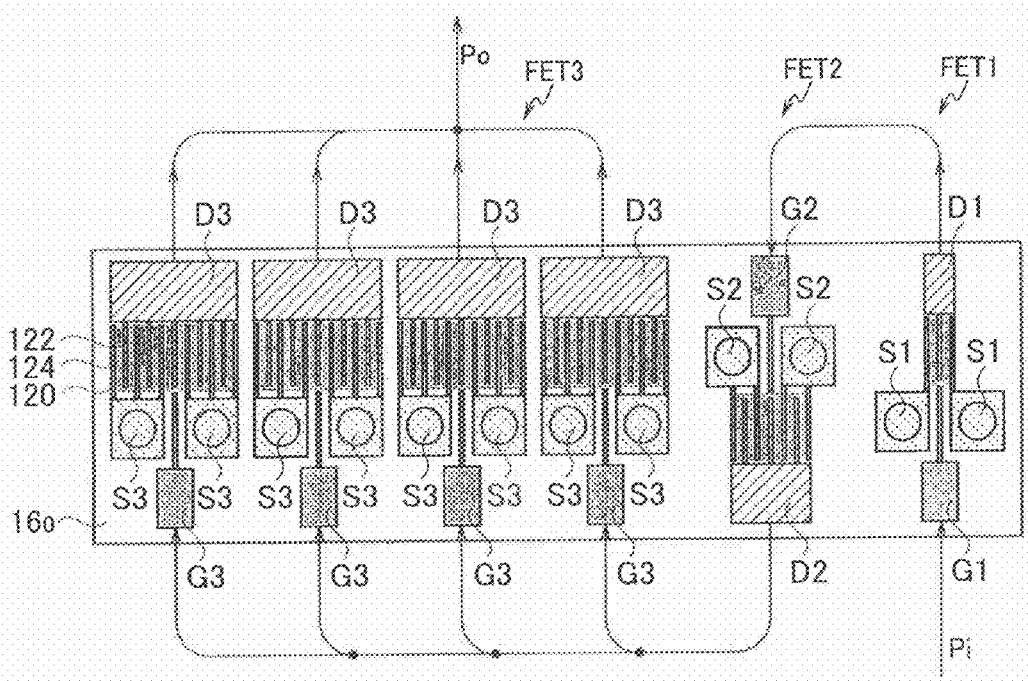
FIG. 14 is a schematic view of a planar pattern configuration of a high frequency circuit having a multi-chip module structure according to the second embodiment, with signal flows in transmission through gate terminal electrodes G1 to G3 and drain terminal electrodes D1 to D3 of discrete transistors FET1 to FET3 disposed on a semiconductor substrate $16_0$.

FIG. 14 is a schematic view of planar pattern configuration describing flows of signal transmission from the gate terminal electrodes G1, G2, and G3 to the drain terminal electrodes D1, D2, and D3 of the discrete transistors FET1, FET2, and FET3, respectively.

As illustrated in FIG. 13 and FIG. 14, according to the second embodiment, there is a high frequency circuit 30 having a multi-chip module structure including: a semiconductor substrate set consisting of a semiconductor substrate $16_0$ formed with discrete transistors FET1, FET2, and FET3 connected in series; a first dielectric substrate set as a set of first dielectric substrates (not shown) formed with capacitors;

a second dielectric substrate set as a set of second dielectric substrate $18_1$ and $18_2$ formed with strip lines; a package substrate 10 configured to arrange thereon the semiconductor substrate $16_0$, the first dielectric substrates, and the second dielectric substrates $18_1$ and $18_2$; and a combination of an input terminal Pi and an output terminal Po disposed on opposite sides of the package substrate 10, in which the discrete transistors FET1, FET2, and FET3 have directions of signal transmission therethrough arranged to alternate every stage thereof.

There are directions of transmission of signals through the discrete transistors FET1, FET2, and FET3, arranged to alternate every stage of discrete transistor. In other words, as illustrated in FIG. 10, FIG. 13, and FIG. 14, there is a direction of signal transmission from a gate terminal electrode G1 to a drain terminal electrode D1 of the discrete transistor FET1 oriented opposite to a direction of signal transmission from a gate terminal electrode G2 to a drain terminal electrode D2 of the discrete transistor FET2, as well as a direction of signal transmission from gate terminal electrodes G3 to drain terminal electrodes D3 of the discrete transistor FET3 oriented opposite to the direction of signal transmission from the gate terminal electrode G2 to the drain terminal electrode D2 of the discrete transistor FET2.

Figure 15:
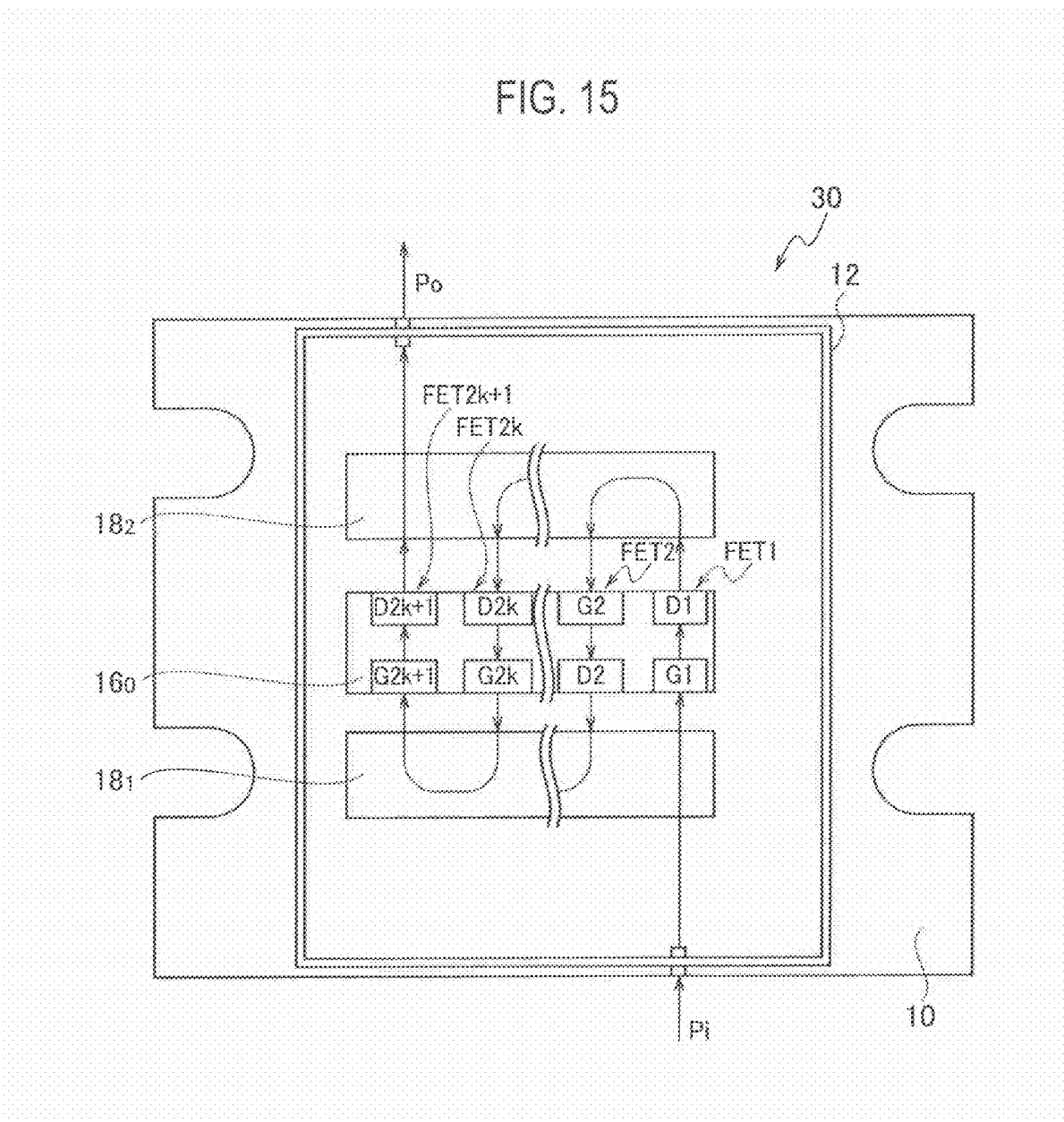
FIG. 15 is a schematic view of a planar pattern configuration of a high frequency circuit having a multi-chip module structure according to the second embodiment, with a signal flow from an input terminal Pi to an output terminal Po for an odd number of stages of discrete transistors disposed on a semiconductor substrate $16_0$.

FIG. 15 is a schematic view of a planar pattern configuration of a high frequency circuit 30 having a multi-chip module structure according to the second embodiment. FIG. 15 describes a signal flow from an input terminal Pi to an output terminal Po for an odd number of stages of discrete transistors FET1, FET2, . . . , FET2$k$, FET2$k$+1 (where k is an arbitrary integer of 1 or more) disposed on a semiconductor substrate $16_0$, and shows the semiconductor substrate $16_0$ together with a set of second dielectric substrates $18_1$ and $18_2$ put in peripheral areas thereof, while omitting a set of first dielectric substrates $14_1$ to $14_4$. It will be seen that, like FIG. 13, FIG. 15 shows transmission of signals from a drain terminal electrode of an arbitrary odd-numbered stage to a corresponding gate terminal electrode of an even-numbered stage by a flow path passing an area on the second dielectric substrate $18_2$, while this flow path passes corresponding areas on the omitted first dielectric substrates $14_2$ and $14_4$, as well. Likewise, it will also be seen that, like FIG. 13, FIG. 15 shows transmission of signals from a drain terminal electrode of an arbitrary even-numbered stage to a corresponding gate terminal electrode of an odd-numbered stage by a flow path passing an area on the second dielectric substrate $18_1$, while this flow path passes a corresponding area on the omitted first dielectric substrate $14_3$, as well.

In the high frequency circuit 30 having a multi-chip module structure according to the second embodiment, as illustrated in FIG. 15, there is arrangement made of the odd number of stages of discrete transistors FET1, FET2, . . . , FET2$k$, FET2$k$+1 to have a direction of signal transmission from a gate terminal electrode to a drain terminal electrode at a respective odd-numbered stage oriented perpendicular to the sides on which the input terminal Pi and the output terminal Po are disposed, and in an identical sense to the direction of input or output signal transmission between the input terminal Pi and the output terminal Po.

In the high frequency circuit 30 having a multi-chip module structure according to the second embodiment, as illustrated in FIG. 15, there is arrangement made of the odd number of stages of discrete transistors FET1, FET2, . . . , FET2$k$, FET2$k$+1 to have a direction of signal transmission from a gate terminal electrode to a drain terminal electrode at a respective even-numbered stage oriented perpendicular to the sides on which the input terminal Pi and the output terminal Po are disposed, and in an opposite sense to the direction of input or output signal transmission between the input terminal Pi and the output terminal Po.

There are directions of signal transmission from gate terminal electrodes G1 to G2$k$+1 to drain terminal electrodes D1 to D2$k$+1 of the stages of discrete transistors FET1 to FET2K+1, arranged to alternate every stage. That is, as illustrated in FIG. 15, there is a direction of signal transmission from a gate terminal electrode G1 to a drain terminal electrode D1 of a discrete transistor FET1 oriented opposite to a direction of signal transmission from a gate terminal electrode G2 to a drain terminal electrode D2 of a discrete transistor FET2, as well as a direction of signal transmission from a gate terminal electrode G3 to a drain terminal electrode D3 of a discrete transistor FET3 oriented opposite to the direction of signal transmission from the gate terminal electrode G2 to the drain terminal electrode D2 of the discrete transistor FET2, there being similar extension to a direction of signal transmission from a gate terminal electrode G2$k$ to a drain terminal electrode D2$k$ of a discrete transistor FET2$k$ oriented opposite to a direction of signal transmission from a gate terminal electrode G2$k$+1 to a drain terminal electrode D2$k$+1 of a discrete transistor FET2$k$+1.

According to the second embodiment, there is an odd number of stages of discrete transistors FET1, FET2, . . . , FET2$k$, FET2$k$+1 disposed on a semiconductor substrate $16_0$, with a combination of input terminal Pi and output terminal Po disposed at opposite sides of a package substrate 10, thereby successfully avoiding cross-talks between input and output signals.

[Modification of the Second Embodiment]

Figure 16:
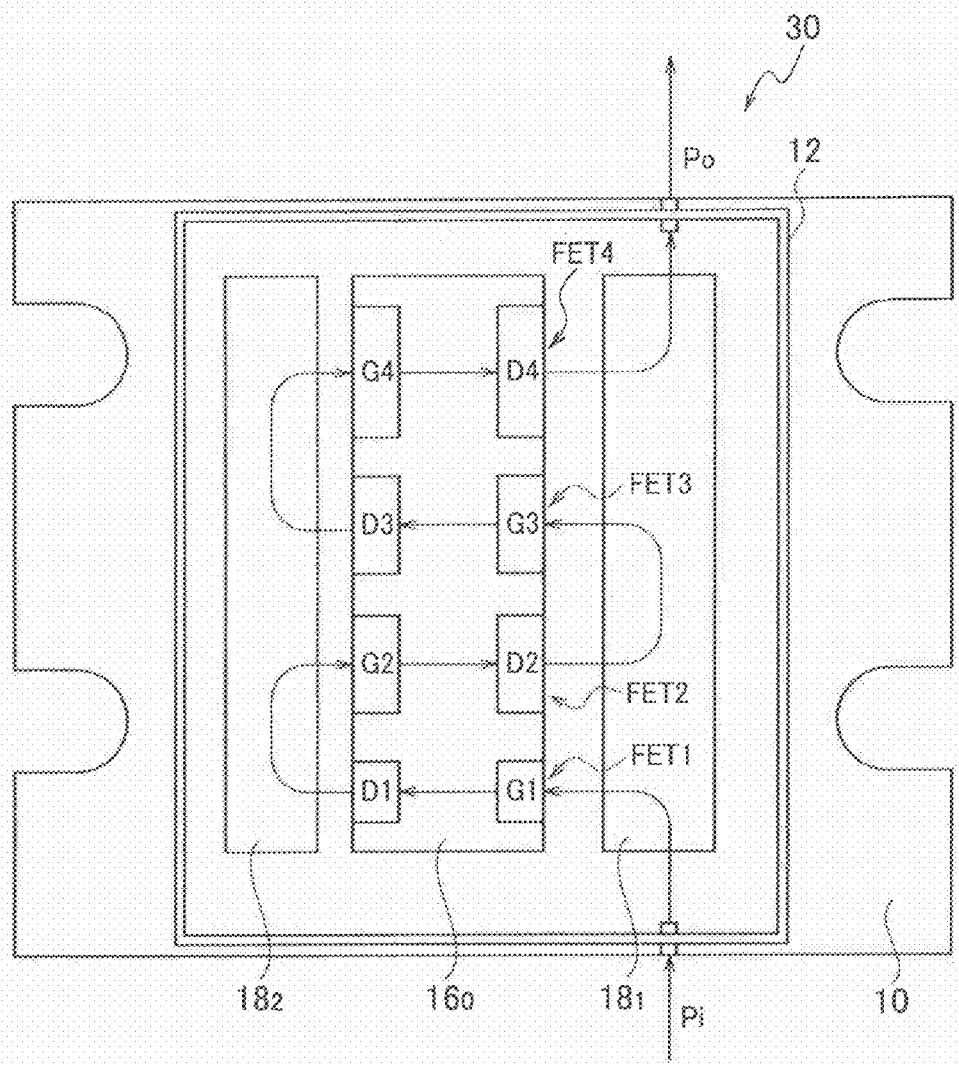
FIG. 16 is a schematic view of a planar pattern configuration of a high frequency circuit having a multi-chip module structure according to a modification of the second embodiment, with a signal flow from an input terminal Pi to an output terminal Po for discrete transistors FET1 to FET4 disposed on a semiconductor substrate $16_0$.

FIG. 16 is a schematic view of a planar pattern configuration of a high frequency circuit 30 having a multi-chip module structure according to a modification or modified example of the second embodiment. FIG. 16 describes a signal flow from an input terminal Pi to an output terminal Po for a set of discrete transistors FET1, FET2, FET3, and FET4 disposed on a semiconductor substrate $16_0$, and shows the semiconductor substrate $16_0$ together with a set of second dielectric substrates $18_1$ and $18_2$ put in peripheral areas thereof, while omitting a set of first dielectric substrates and so no.

Figure 17:
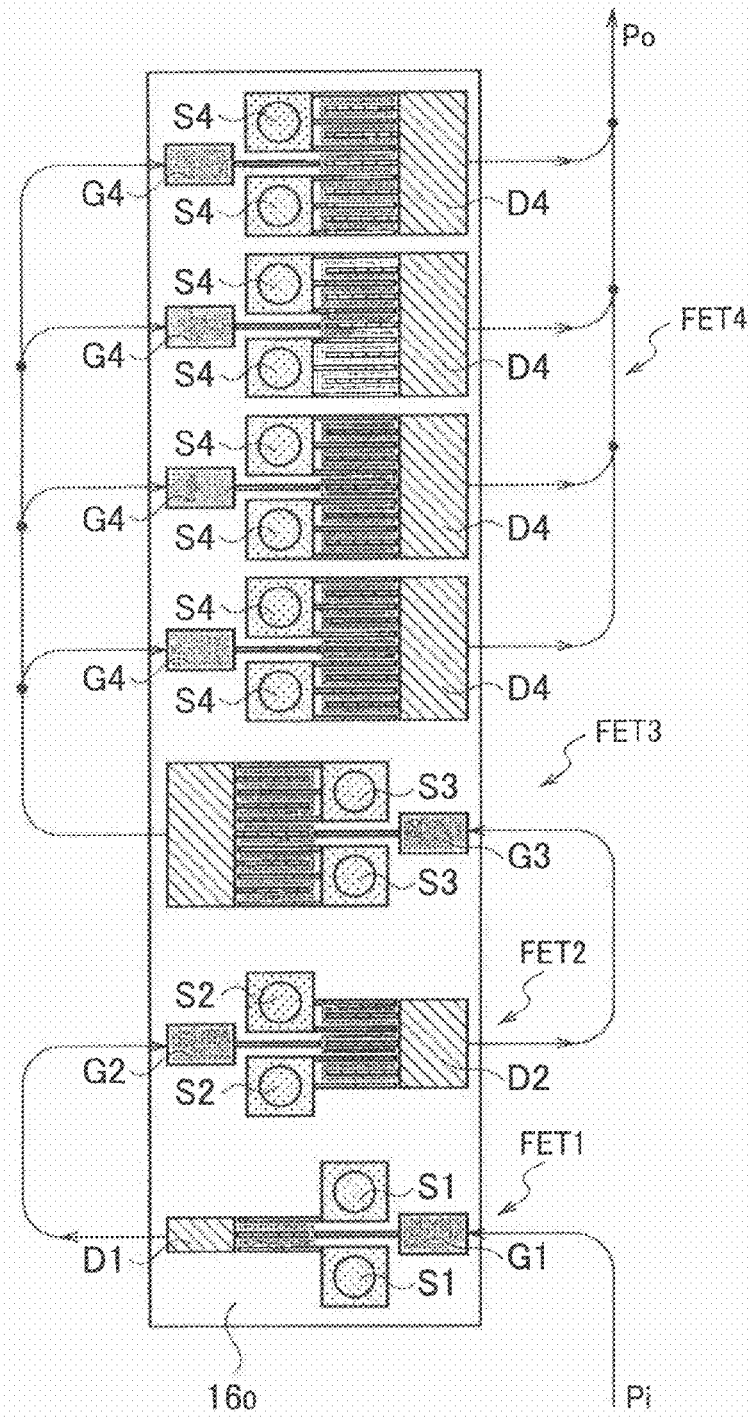
FIG. 17 is a schematic view of a planar pattern configuration of a high frequency circuit having a multi-chip module structure according to the modification of the second embodiment, with signal flows in transmission through gate terminal electrodes G1 to G4 and drain terminal electrodes D1 to D4 of discrete transistors FET1 to FET4 disposed on a semiconductor substrate $16_0$.

FIG. 17 is a schematic view of planar pattern configuration describing flows of signal transmission from gate terminal electrodes to drain terminal electrodes of the discrete transistors FET1, FET2, FET3, and FET4, respectively.

As illustrated in FIG. 16 and FIG. 17, according to the modification of the second embodiment, as well, there is a high frequency circuit 30 having a multi-chip module structure including: a semiconductor substrate set consisting of a semiconductor substrate $16_0$ formed with discrete transistors FET1, FET2, FET3, and FET4 connected in series; a first dielectric substrate set as a set of first dielectric substrates (not shown) formed with capacitors; a second dielectric substrate set as a set of second dielectric substrate $18_1$ and $18_2$ formed with strip lines; a package substrate 10 configured to arrange thereon the semiconductor substrate $16_0$, the first dielectric substrates, and the second dielectric substrates $18_1$ and $18_2$; and a combination of an input terminal Pi and an output terminal Po disposed on opposite sides of the package substrate 10, in which the discrete transistors FET1, FET2, FET3, and FET4 have directions of signal transmission therethrough arranged to alternate every stage thereof, like the second embodiment.

In other words, as illustrated in FIG. 16 and FIG. 17, there is a direction of signal transmission from a gate terminal electrode G1 to a drain terminal electrode D1 of the discrete transistor FET1 oriented opposite to a direction of signal transmission from a gate terminal electrode G2 to a drain terminal electrode D2 of the discrete transistor FET2, as well as a direction of signal transmission from a gate terminal electrode G3 to a drain terminal electrode D3 of the discrete transistor FET3 oriented opposite to the direction of signal transmission from the gate terminal electrode G2 to the drain terminal electrode D2 of the discrete transistor FET2, and a direction of signal transmission from gate terminal electrodes G4 to drain terminal electrodes D4 of the discrete transistor FET4 oriented opposite to the direction of signal transmission from the gate terminal electrode G3 to the drain terminal electrode D3 of the discrete transistor FET3.

Figure 18:
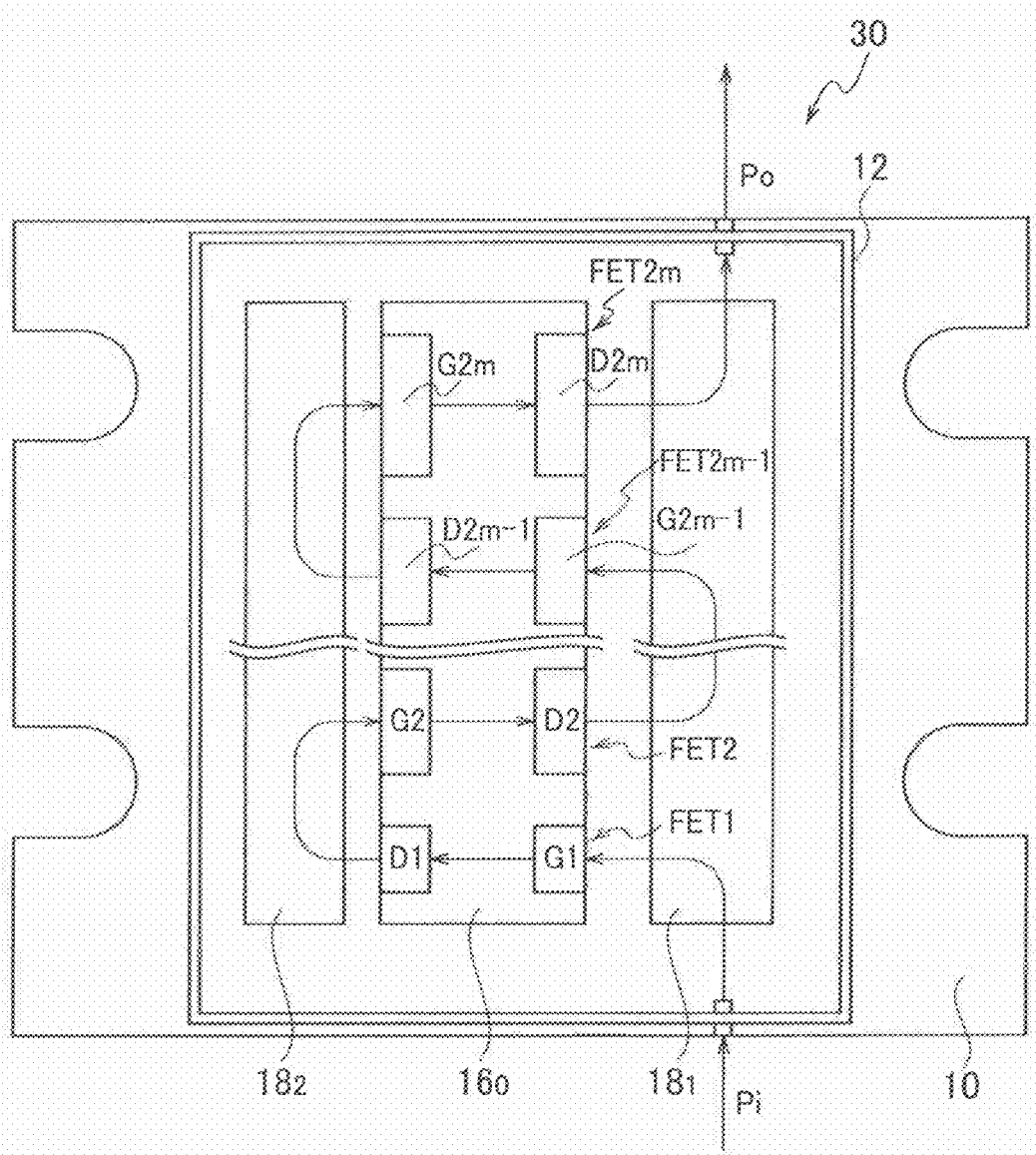
FIG. 18 is a schematic view of a planar pattern configuration of a high frequency circuit having a multi-chip module structure according to the second embodiment, with a signal flow from an input terminal Pi to an output terminal Po for an even number of stages of discrete transistors disposed on a semiconductor substrate $16_0$.

FIG. 18 is a schematic view of a planar pattern configuration of a high frequency circuit 30 having a multi-chip module structure according to the modification of the second embodiment. FIG. 18 describes a signal flow from an input terminal Pi to an output terminal Po for an even number of stages of discrete transistors FET1, FET2, . . . , FET2$m$−1, FET2$m$ (where m is an arbitrary integer of 1 or more) disposed on a semiconductor substrate $16_0$, and shows the semiconductor substrate $16_0$ together with a set of second dielectric substrates $18_1$ and $18_2$ put in peripheral areas thereof, while omitting a set of first dielectric substrates and so on.

In the high frequency circuit 30 having a multi-chip module structure according to the modification of the second embodiment, as illustrated in FIG. 18, there is arrangement made of the even number of stages of discrete transistors FET1, FET2, . . . , FET2$m$−1, FET2$m$ to have a direction of signal transmission from a gate terminal electrode to a drain terminal electrode at a respective stage oriented to be parallel to the sides on which the input terminal Pi and the output terminal Po are disposed, and perpendicular to the direction of input or output signal transmission between the input terminal Pi and the output terminal Po.

Further, the discrete transistors FET1, FET2, . . . , FET2$m$−1, FET2$m$ are arranged to have a direction of signal transmission from a gate terminal electrode to a drain terminal electrode at a respective odd-numbered stage thereof oriented opposite to a direction of signal transmission from a gate terminal electrode to a drain terminal electrode at a respective even-numbered stage thereof.

That is, as illustrated in FIG. 18, there is a direction of signal transmission from a gate terminal electrode G1 to a drain terminal electrode D1 of a discrete transistor FET1 oriented opposite to a direction of signal transmission from a gate terminal electrode G2 to a drain terminal electrode D2 of a discrete transistor FET2, as well as a direction of signal transmission from a gate terminal electrode G3 to a drain terminal electrode D3 of a discrete transistor FET3 oriented opposite to the direction of signal transmission from the gate terminal electrode G2 to the drain terminal electrode D2 of the discrete transistor FET2, there being similar extension to a direction of signal transmission from a gate terminal electrode G2$m$−1 to a drain terminal electrode D2$m$−1 of a discrete transistor FET2$m$−1 oriented opposite to a direction of signal transmission from a gate terminal electrode G2$m$ to a drain terminal electrode D2$m$ of a discrete transistor FET2$m$.

According to the modification of the second embodiment, there may be a high frequency circuit having a multi-chip module structure, including an even number of stages of discrete transistors FET1 to FET2$m$ (m: an arbitrary integer of 1 or more) disposed on a single semiconductor substrate $16_0$, in combination with an input terminal Pi and an output terminal Po disposed on opposite sides of a package substrate 10, allowing for successful avoidance of cross talks between input and signals.

According to the second or the modified embodiment, it is possible to implement a wide reduction of capacitor area and stab length, allowing for miniaturization in size of integrated circuits for application to microwaves or millimeter waves.

According to the second or the modified embodiment, there are combinations of transistors, matching circuits, and bias circuits individually arranged for connection in a package, allowing for a reduced size of device as a package, with an inexpensive package cost.

According to the second or the modified embodiment, it is possible to provide an inexpensive high frequency circuit having a multi-chip module structure, affording to form matching circuits on an inexpensive dielectric substrate set, and miniaturize sizes of expensive semiconductor.

According to the second or the modified embodiment, it is possible to implement miniaturization in size of integrated circuits to a still advanced degree relative to the first embodiment.

According to the second or the modified embodiment, it is possible to provide an inexpensive high frequency circuit having a multi-chip module structure, allowing for miniaturization in size of integrated circuits for application to microwaves or millimeter waves.

According to the first, or the second or the modified embodiment, there may well be a high frequency circuit having a multi-chip module structure, including discrete transistors each configured as am amplifier in the form not simply of an FET or a HEMT, but also of a LDMOS (Laterally Diffused Metal-Oxide-Semiconductor Field Effect Transistor), or an HBT (Hetero-junction Bipolar Transistor), or as a MEMS (Micro Electro Mechanical Systems) or the like.

According to the first, or the second or the modified embodiment, there may well be a high frequency circuit having a multi-chip module structure, including four or more stages of discrete transistors connected in a cascade, beyond the three stages described.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A high frequency circuit having a multi-chip module structure comprising:
    a semiconductor substrate set formed with discrete transistors which are connected in series;
    a first dielectric substrate set formed with capacitors; and
    a second dielectric substrate set formed with strip lines,
    wherein the semiconductor substrate set consists of a single semiconductor substrate formed exclusively with the discrete transistors,
    wherein the discrete transistors have directions of signal transmission between gate terminal electrodes and drain terminal electrodes thereof arranged to alternate every stage.

2. A high frequency circuit having a multi-chip module structure comprising:
    a semiconductor substrate set formed with discrete transistors which are connected in series;
    a first dielectric substrate set formed with capacitors; and
    a second dielectric substrate set formed with strip lines, wherein the semiconductor substrate set comprises separate semiconductor substrates formed exclusively with the discrete transistors for every stage, wherein the discrete transistors have directions of signal transmission between gate terminal electrodes and drain terminal electrodes thereof arranged to alternate every stage.

3. The high frequency circuit according to claim 1, wherein the semiconductor substrate set, the first dielectric substrate set, and the second dielectric substrate set are disposed on a package substrate for accommodation in a package, and the semiconductor substrate set with the discrete transistors thereon is mounted directly on a surface of the package substrate.

4. The high frequency circuit according to claim 1, wherein the semiconductor substrate set simply has the discrete transistors, and gate terminal electrodes, source terminal electrodes, and drain terminal electrodes of the discrete transistors as circuit elements thereon.

5. The high frequency circuit according to claim 1, wherein the discrete transistors include in a final stage thereof a discrete transistor and in a previous stage thereto a discrete transistor, a gate width of the discrete transistor in the previous stage being narrower than a gate width of the discrete transistor in the final stage.

6. A high frequency circuit having a multi-chip module structure comprising:
a semiconductor substrate set consists of a single semiconductor substrate formed exclusively with discrete transistors connected in series;
a first dielectric substrate set formed with capacitors;
a second dielectric substrate set formed with strip lines;
a package substrate for the semiconductor substrate set, the first dielectric substrate set, and the second dielectric substrate set to be disposed thereon; and
a combination of an input terminal and an output terminal disposed on opposite sides of the package substrate, wherein
the discrete transistors have directions of signal transmission between gate terminal electrodes and drain terminal electrodes thereof arranged to alternate every stage.

7. The high frequency circuit according to claim 6, wherein the discrete transistors are arranged in an odd number of stages, and have a direction of signal transmission between gate and drain terminal electrodes at a respective odd-numbered stage thereof oriented to be perpendicular to the sides the input terminal and the output terminal are disposed on, and equal to a direction of input or output signal transmission between the input terminal and the output terminal.

8. The high frequency circuit according to claim 7, wherein the discrete transistors have a direction of signal transmission between gate and drain terminal electrodes at a respective even-numbered stage thereof oriented to be perpendicular to the sides the input terminal and the output terminal are disposed on, and opposite to the direction of input or output signal transmission.

9. The high frequency circuit according to claim 6, wherein the discrete transistors are arranged in an even number of stages, and have a direction of signal transmission between gate and drain terminal electrodes at a respective stage thereof oriented to be parallel to the sides the input terminal and the output terminal are disposed on, and perpendicular to a direction of input or output signal transmission between the input terminal and the output terminal.

10. The high frequency circuit according to claim 9, wherein the discrete transistors have a direction of signal transmission between gate and drain terminal electrodes at a respective odd-numbered stage thereof oriented opposite to a direction of signal transmission between gate and drain terminal electrodes at a respective even-numbered stage thereof.

11. The high frequency circuit according to claim 1, wherein the discrete transistors comprise:
a semi-insulating substrate;
sets of gate finger electrodes, source finger electrodes, and drain finger electrodes each formed with fingers and disposed on a first surface area of the semi-insulating substrate;
sets of gate terminal electrodes, source terminal electrodes, and drain terminal electrodes formed with corresponding subsets of the sets of gate finger electrodes, source finger electrodes, and drain finger electrodes and disposed on the first surface area of the semi-insulating substrate;
a set of via holes each disposed under a corresponding source terminal electrode; and
a grounding electrode disposed on a second surface area opposite to the first surface area of the semi-insulating substrate, and connected through the set of via holes to the set of source terminal electrodes.

12. The high frequency circuit according to claim 11, wherein the semi-insulating substrate comprises a GaAs substrate, a SiC substrate, a GaN substrate, a SiC substrate with a GaN epitaxial layer formed thereon, a SiC substrate with a hetero-junction epitaxial layer composed of AaN/AlGaN formed thereon, a sapphire substrate, or a diamond substrate.

13. The high frequency circuit according to claim 1, wherein a transfer line inserted between the discrete transistors is disposed on the first dielectric substrate set.

14. The high frequency circuit according to claim 2, wherein a transfer line inserted between the discrete transistors is disposed on the first dielectric substrate set.

15. The high frequency circuit according to claim 6, wherein a transfer line inserted between the discrete transistors is disposed on the first dielectric substrate set.

* * * * *